US008242527B2

(12) United States Patent
Lee et al.

(10) Patent No.: US 8,242,527 B2
(45) Date of Patent: Aug. 14, 2012

(54) LIGHT EMITTING DEVICE AND METHOD OF MANUFACTURING THE SAME

(75) Inventors: Si-Chen Lee, Taipei (TW); Yu-Wei Jiang, Taipei (TW); Yi-Ting Wu, Taipei (TW); Ming-Wei Tsai, Taipei (TW); Pei-En Chang, Taipei (TW)

(73) Assignee: National Taiwan University, Taipei (TW)

( * ) Notice: Subject to any disclaimer, the term of this patent is extended or adjusted under 35 U.S.C. 154(b) by 187 days.

(21) Appl. No.: 12/728,377

(22) Filed: Mar. 22, 2010

(65) Prior Publication Data

US 2010/0213492 A1 Aug. 26, 2010

Related U.S. Application Data

(63) Continuation-in-part of application No. 11/591,640, filed on Nov. 2, 2006, now abandoned.

(30) Foreign Application Priority Data

Mar. 17, 2010 (TW) ............................... 99107890 A

(51) Int. Cl.
*H01L 33/00* (2010.01)

(52) U.S. Cl. .............. 257/98; 257/13; 257/79; 257/432; 257/E25.004; 257/E33.001

(58) Field of Classification Search .................... 257/13, 257/79, 98, 432, E25.004, E33.001
See application file for complete search history.

(56) References Cited

U.S. PATENT DOCUMENTS

| | | | | |
|---|---|---|---|---|
| 2005/0205886 | A1 | 9/2005 | Murofushi et al. | |
| 2007/0012937 | A1 | 1/2007 | Liu et al. | |
| 2007/0034978 | A1 | 2/2007 | Pralle et al. | |
| 2007/0280318 | A1 | 12/2007 | Yoshimoto et al. | |
| 2011/0037981 | A1 * | 2/2011 | Zhu et al. ...................... | 356/369 |

OTHER PUBLICATIONS

Lee, et al.; "Coherent Thermal Emission fro One-Dimensional Photonic Crystals:" Applied Science Letters; vol. 87; 2005; pp. 071904.
Enoch, et al.; "Simple Layer-by-Layer Photonic Crystal for the Control of Thermal Emission;" Applied Science Letters; vol. 86; 2005; pp. 261101.
Pralle, et al.; "Photonic Crystal Enhanced Narrow-Band Infrared Emitters;" Applied Science Letters; vol. 81, No. 25; 2002; pp. 4685.
Narayanaswamy, et al.; "Thermal Emission Control with One-Dimensional Metallodielectric Photonic Crystals;" Physical Review; vol. 70; 2004; pp. 125101.
Celanovic, et al.; "Resonant-Cavity Enhanced Thermal Emission;" Physical Review; vol. 72; 2005; pp. 075127.
Kady, et al.; "Tunable Narrow-Band Infrared Emitters from Hexagonal Lattices;" Photonics and Nanostructures Fundamentals and Applications; 2003; pp. 69-77.

* cited by examiner

*Primary Examiner* — Andy Huynh
(74) *Attorney, Agent, or Firm* — Thomas|Kayden

(57) ABSTRACT

A light emitting device for generating infrared light includes a substrate, a first metal layer, a dielectric layer and a second metal layer. The substrate has a first surface. The first metal layer is formed on the first surface of the substrate. The dielectric layer is formed on the first metal layer. A thickness of the dielectric layer is greater than a particular value. The second metal layer is formed on the dielectric layer. When the light emitting device is heated, the dielectric layer has a waveguide mode such that the infrared light generated by the light emitting device can be transmitted in the dielectric layer. A wavelength of the infrared light generated in the waveguide mode relates to the thickness of the dielectric layer.

8 Claims, 8 Drawing Sheets

LIGHT EMITTING DEVICE AND METHOD OF MANUFACTURING THE SAME

This is a continuation-in-part application of U.S. application Ser. No. 11/591,640, filed Nov. 2, 2006, and claims the benefit of Taiwan application Serial No. 99107890, filed Mar. 17, 2010, the subject matter of which is incorporated herein by reference.

BACKGROUND OF THE INVENTION

1. Field of the Invention

The invention relates in general to a light emitting device and a method of manufacturing the same, and more particularly to an infrared light emitting device and a method of manufacturing the same.

2. Description of the Related Art

An infrared light emitting device is mainly applied to the optical communication industry. The current infrared light emitting device may be manufactured by a few methods, such as epitaxy, and by using a semiconductor element (III-V group element) as the material. However, the infrared light element with the middle or long wavelength must be manufactured at the low temperature, so expensive cooling equipment is needed. Alternatively, the conventional infrared light element needs to use a multi-layer film structure so that the processing complexity is increased. In addition, the ratio of the full width at half maximum (FWHM) $\Delta\lambda$ to the peak wavelength (Peak) $\lambda$ of the spectrum of the current infrared light element is not ideal.

FIG. 1A (Prior Art) is a schematic illustration showing an infrared light emitting device 1 according to the prior art. FIG. 1B (Prior Art) is a top view showing the infrared light emitting device 1 of FIG. 1A. FIG. 2 (Prior Art) shows the spectrum of the infrared light emitting device 1 of FIG. 1A. As shown in FIGS. 1A, 1B and 2, the infrared light emitting device 1 of FIG. 1A is disclosed by El-Kady et al. in "Photonics and Nanostructures-Fundamentals and Applications", Volume 1, Issue 1, 69-77 (2003). El-Kady et al. utilize a photo process to form a photoresist layer having periodicity on a surface of a silicon substrate 10. Then, a metal layer 12 and a protection layer (e.g., a graphite layer) 14 are formed on the surface of the silicon substrate 10 by a vapor deposition process, and then a plurality of holes with a depth of 5 μm is formed on the silicon substrate 10, so as to obtain a periodic surface texture. A black body radiation source of the holes may couple photons to form a surface plasmon (SP). As shown in FIG. 2, a ratio of a FWHM ($\Delta\lambda$) to a peak wavelength ($\lambda$) is about 11.9%. However, such a ratio cannot satisfy the requirements in some applications. Thus, it is an important subject in the industry to develop an infrared light emitting element, which can operate at the high temperature and has the smaller ratio of the FWHM ($\Delta\lambda$) to the peak wavelength ($\lambda$).

SUMMARY OF THE INVENTION

The invention is directed to a light emitting device, which can emit infrared light with the narrower bandwidth in the high-temperature operation by designing the dielectric layers with different thicknesses to effectively control the waveguide mode of the dielectric layer.

According to a first aspect of the present invention, a light emitting device for generating infrared light is provided. The light emitting device includes a substrate, a first metal layer, a dielectric layer and a second metal layer. The substrate has a first surface. The first metal layer is formed on the first surface of the substrate. The dielectric layer is formed on the first metal layer. A thickness of the dielectric layer is greater than a particular value. The second metal layer is formed on the dielectric layer. When the light emitting device is heated, the dielectric layer has a waveguide mode such that the infrared light generated by the light emitting device is transmitted in the dielectric layer, and a wavelength of the infrared light generated in the waveguide mode relates to the thickness of the dielectric layer.

According to a second aspect of the present invention, a method of manufacturing a light emitting device for generating infrared light is provided. The method includes the steps of: providing a substrate having a first surface; forming a first metal layer on the first surface of the substrate; forming a dielectric layer, having a specific thickness, on the first metal layer; and forming a second metal layer on the dielectric layer. When the light emitting device is heated, the dielectric layer has a waveguide mode such that the infrared light generated by the light emitting device is transmitted in the dielectric layer, and a wavelength of the infrared light generated in the waveguide mode relates to the thickness of the dielectric layer.

According to a third aspect of the present invention, a light emitting device for generating infrared light is provided. The light emitting device includes a substrate, a first metal layer, a dielectric layer and a second metal layer. The substrate has a first surface. The first metal layer is formed on the first surface of the substrate. The dielectric layer is formed on the first metal layer. A thickness of the dielectric layer is smaller than 500 nanometers (nm). The second metal layer is formed on the dielectric layer. The second metal layer has at least one first hole.

The invention will become apparent from the following detailed description of the preferred but non-limiting embodiments. The following description is made with reference to the accompanying drawings.

DETAILED DESCRIPTION OF THE INVENTION

The disclosure provides a light emitting device and a method of manufacturing the same. The light emitting device generates infrared light. The light emitting device includes a substrate, a first metal layer, a dielectric layer and a second metal layer. The substrate has a first surface. The first metal layer is formed on the first surface of the substrate. The dielectric layer is formed on the first metal layer, and a thickness of the dielectric layer is greater than a particular value. The second metal layer is formed on the dielectric layer. When the light emitting device is heated, the dielectric layer has a waveguide mode because the thickness of the dielectric layer is greater than the particular value, such that the infrared light generated by the light emitting device may be transmitted in the dielectric layer. In addition, a wavelength of the infrared light generated in the waveguide mode of the dielectric layer may be adjusted by adjusting the thickness of the dielectric layer. That is, the wavelength of the infrared light generated in the waveguide mode of the dielectric layer relates to the thickness of the dielectric layer.

First Embodiment

Figure 3:
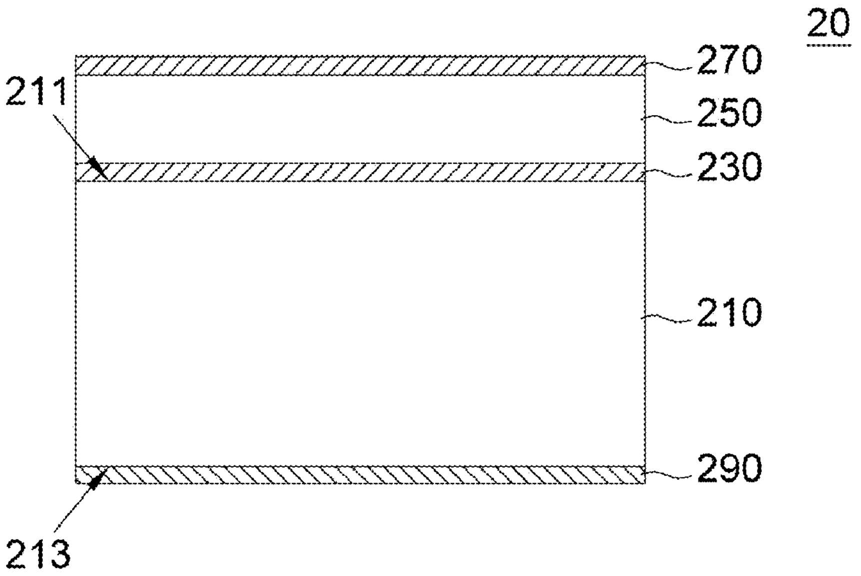
FIG. 3 is a schematic illustration showing a light emitting device according to a first embodiment of the invention.

FIG. 3 is a schematic illustration showing a light emitting device 20 according to a first embodiment of the invention. Referring to FIG. 3, the light emitting device 20 includes a substrate 210, a first metal layer 230, a dielectric layer 250, a second metal layer 270 and a third metal layer 290. The substrate 210 has a first surface 211. The first metal layer 230 is formed on the first surface 211 of the substrate 210. The dielectric layer 250 is formed on the first metal layer 230. The thickness of the dielectric layer 250 is greater than a particular value, such as 1 micron (μm). The second metal layer 270 is formed on the dielectric layer 250. The second metal layer 270 has a particular thickness, such as about 3 to 40 nanometers (nm).

The first metal layer 230 serves as a background radiation suppressing layer and an infrared light reflecting layer having the functions of suppressing the background radiation emitted from the substrate 210 and reflecting the infrared light generated by the dielectric layer 250. Because the thickness of the second metal layer 270 of this embodiment is sufficiently small, the infrared light generated by the dielectric layer 250 may be partially reflected by the second metal layer 270 and partially transmitted through the second metal layer 270.

In this embodiment, the third metal layer 290 serves as a heating source of the light emitting device 20 when a current is conducted. When the current flows through the third metal layer 290, the light emitting device 20 is heated. When the light emitting device 20 is heated, the background radiation emitted from the substrate 210 is blocked by the first metal layer 230, and the emissivity of the first metal layer 230 is very low so that the first metal layer will not emit a lot of thermal radiation. Furthermore, the thickness of the dielectric layer 250 is greater than the particular value, so the dielectric layer 250 has a waveguide mode. The thermal radiation generated by the dielectric layer 250 is restricted in the first metal layer 230 and the second metal layer 270 to oscillate back and forth, and to be transmitted in the dielectric layer 250. After the dielectric layer 250 absorbs the thermal radiation, the electrons of the dielectric layer 250 make the transition from an outer orbit to an inner orbit, and the thermal radiation is converted into optical energy. The result obtained after the thermal radiation of the dielectric layer 250 is repeatedly transmitted and repeatedly resonates in the dielectric layer 250 greatly increases the light intensity of a specific wavelength of infrared light.

In detail, the substrate 210 may be a conductor substrate, an insulation substrate or a semiconductor substrate. The material of the first metal layer 230 is selected from the group consisting of gold (Au), silver (Ag) and a metal having the reflectivity and emissivity respectively ranging from 0.5 to 1 and from 0 to 0.5 in the middle infrared light wave band. The material of the dielectric layer 250 may be oxide, nitride or any other dielectric material or insulation material. The second metal layer 270 includes at least one of silver (Ag) and a metal having the reflectivity ranging from 0.5 to 1 in the middle infrared light wave band. The third metal layer 290 includes at least one of molybdenum (Mo) and a metal having the electrical conductivity ranging from $10^3$ to $6\times10^5$(1/cm-Ohm).

In this embodiment, the third metal layer 290 is formed on a second surface 213 of the substrate 210, which is disposed opposite to the first surface 211. However, the third metal layer 290 is not restricted to be formed on the second surface 213 of the substrate 210, and may also be formed between the substrate 210 and the first metal layer 230. Alternatively, the third metal layer 290 is directly replaced with the first metal layer 230 serving as a heating source. Alternatively, the third metal layer 290 is not needed and the substrate 210 may be directly heated.

Figure 1A:
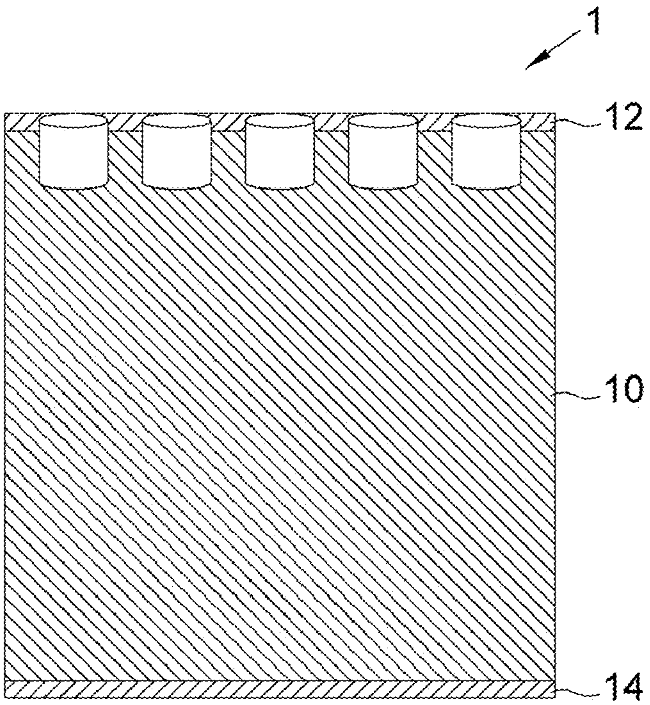
FIG. 1A(PRIOR ART)
FIG. 1A (Prior Art) is a schematic illustration showing an infrared light emitting device according to the prior art.
Figure 1B:
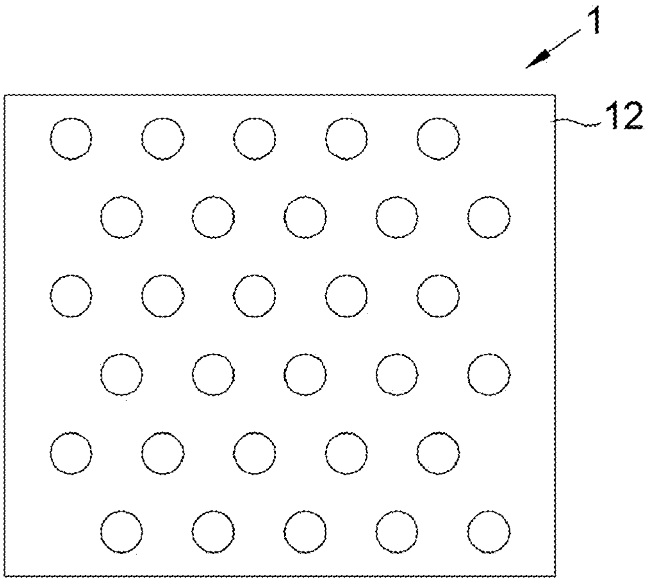
FIG. 1B(PRIOR ART)
FIG. 1B (Prior Art) is a top view showing the infrared light emitting device of FIG. 1A.
Figure 2:
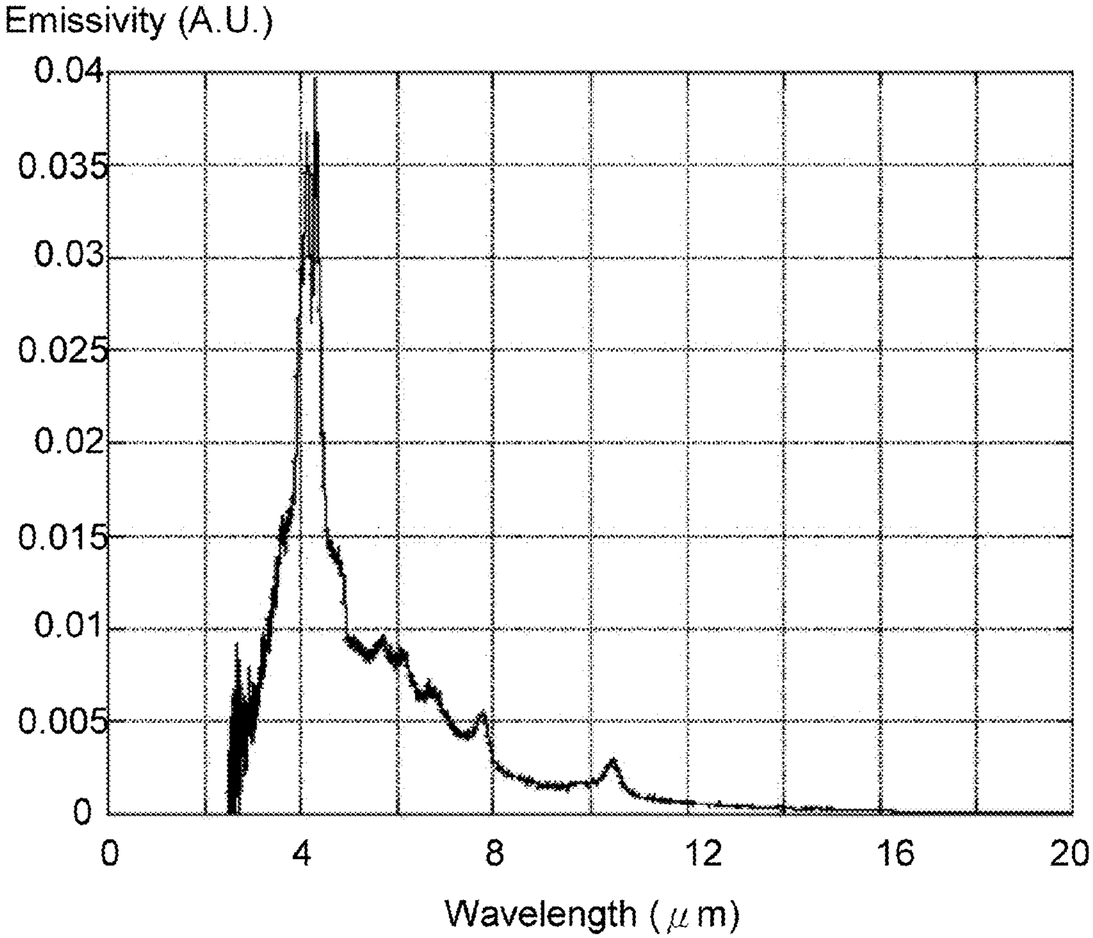
FIG. 2(PRIOR ART)
FIG. 2 (Prior Art) shows the spectrum of the infrared light emitting device of FIG. 1A.

In this embodiment, the thickness of the dielectric layer 250 has a particular value so that the dielectric layer 250 has a waveguide mode and the infrared light generated when the light emitting device is heated may be transmitted in the dielectric layer 250. Furthermore, after the infrared light is repeatedly transmitted and repeatedly resonates in the dielectric layer 250, the infrared light having the ratio of the FWHM (Δλ) to the peak wavelength (λ) may be obtained to be about 3%, which is better than the ratio of the FWHM to the peak wavelength in the infrared light emitting device 1 shown in FIGS. 1A and 1B. In addition, this embodiment may achieve the object of adjusting the infrared wavelength by adjusting the thickness of the dielectric layer.

Figure 4A:
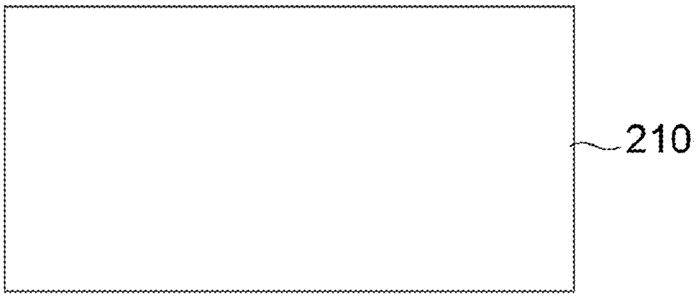
FIGS. 4A to 4E show flows of manufacturing the light emitting device according to the first embodiment of the invention.
Figure 4B:
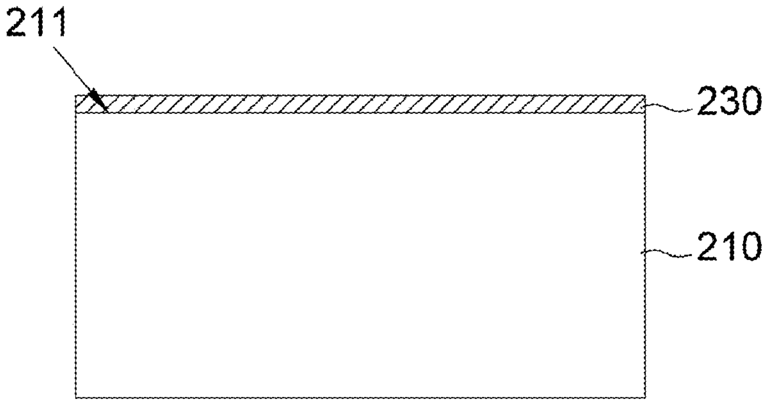
Figure 4C:
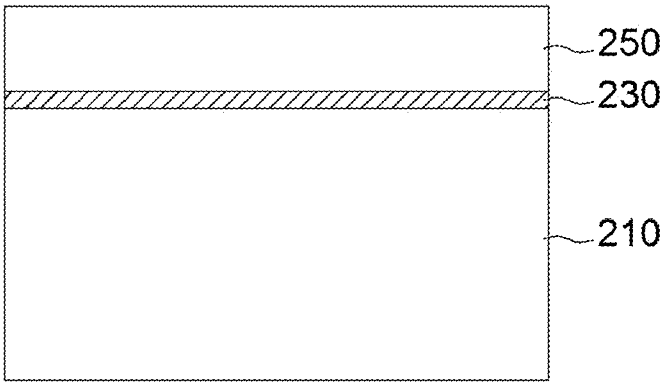
Figure 4D:
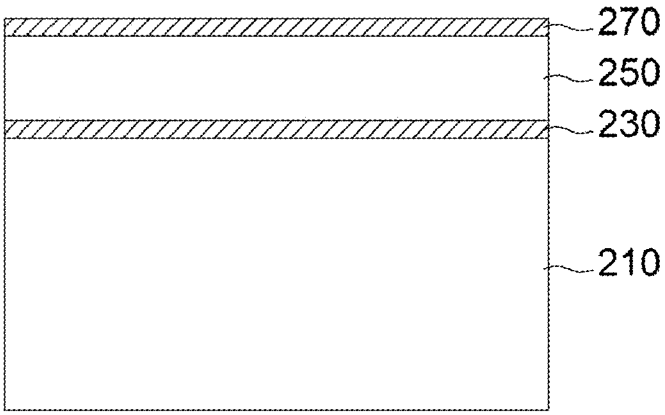
Figure 4E:
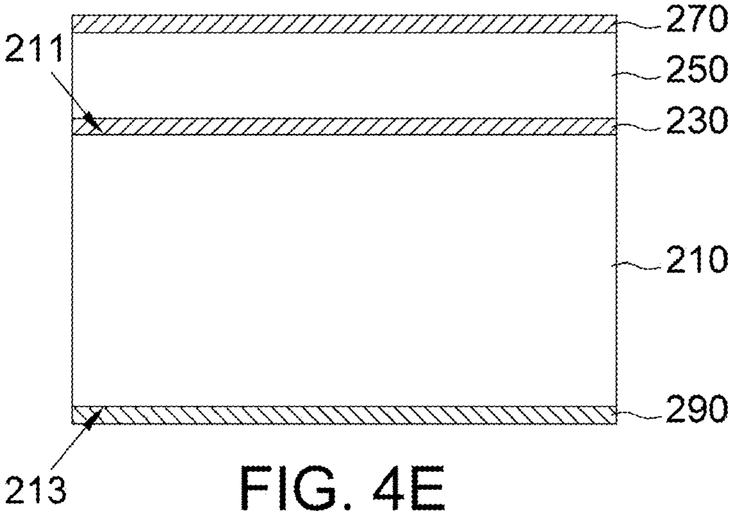

FIGS. 4A to 4E show flows of manufacturing the light emitting device 20 according to the first embodiment of the invention. Referring to FIGS. 4A to 4E, the method includes the following steps. First, as shown in FIG. 4A, the substrate 210 is provided. Next, as shown in FIG. 4B, the first metal layer 230 is formed on the first surface 211 of the substrate 210 by vapor deposition process, for example. The thickness of the first metal layer 230 may be equal to, but without limitation to, 100 nanometers (nm). Then, as shown in FIG. 4C, the dielectric layer 250 having the thickness greater than the particular value is formed on the first metal layer 230 by vapor deposition process, for example, but without limitation. Next, as shown in FIG. 4D, the second metal layer 270 is formed on the dielectric layer 250 by vapor deposition process, for example, but without limitation. Finally, as shown in FIG. 4E, the third metal layer 290 is formed on the second surface 213 of the substrate 210 disposed opposite to the first surface 211 of the substrate 210 by vapor deposition process, for example, but without limitation, or formed between the first surface 211 of the substrate 210 and the first metal layer 230 (not shown). The thickness of the third metal layer 290 may be equal to, but without limitation to, 300 nm.

Second Embodiment

Figure 5:
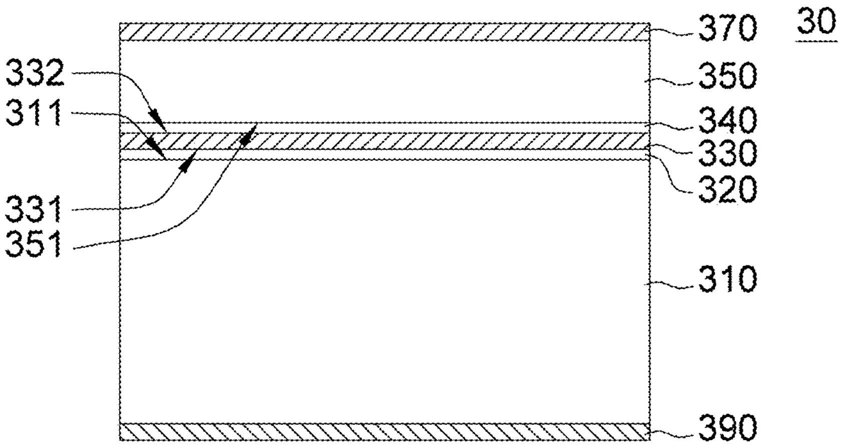
FIG. 5 is a schematic illustration showing a light emitting device according to a second embodiment of the invention.

FIG. 5 is a schematic illustration showing a light emitting device 30 according to a second embodiment of the invention. Referring to FIG. 5, the light emitting device 30 includes a substrate 310, a first metal adhesive layer 320, a first metal layer 330, a second metal adhesive layer 340, a dielectric layer 350, a second metal layer 370 and a third metal layer 390. The difference between the light emitting device 30 of this embodiment and the light emitting device 20 of the first embodiment is that the light emitting device 30 of this embodiment further includes the first metal adhesive layer 320 and the second metal adhesive layer 340. As shown in FIG. 5, the first metal adhesive layer 320 is formed between the substrate 310 and the first metal layer 330, and the second metal adhesive layer 340 is formed between the first metal layer 330 and the dielectric layer 350.

If the physical property between the first metal layer 330 and the substrate 310, such as the bonded strength, is too low and the first metal layer 330 is directly formed on the substrate 310, the firmness therebetween may become poor. Thus, the first metal adhesive layer 320 having the physical property ranging between the substrate 310 and the first metal layer 330 is selected to enhance the firmness between a first surface 311 of the substrate 310 and a first surface 331 of the first metal layer 330. Similarly, the second metal adhesive layer 340 having the physical property ranging between the first metal layer 330 and the dielectric layer 350 is selected to enhance the firmness between a second surface 332 of the first metal layer 330 and a first surface 351 of the dielectric layer 350. Thus, when the light emitting device 30 is heated to the high temperature, the possibility of generating peel off between the substrate and the first metal layer, or between the first metal layer and the dielectric layer can be greatly reduced.

The materials of the first metal adhesive layer 320 and the second metal adhesive layer 340 are selected from the group consisting of transition metals, including titanium (Ti), chromium (Cr), tantalum (Ta), zirconium (Zr) and the like, a metal having the surface bonding strength greater than 20 MPa, a metal having the surface bonding strength greater than gold (Au) and silicon dioxide ($SiO_2$), and combinations thereof.

Third Embodiment

Figure 6A:
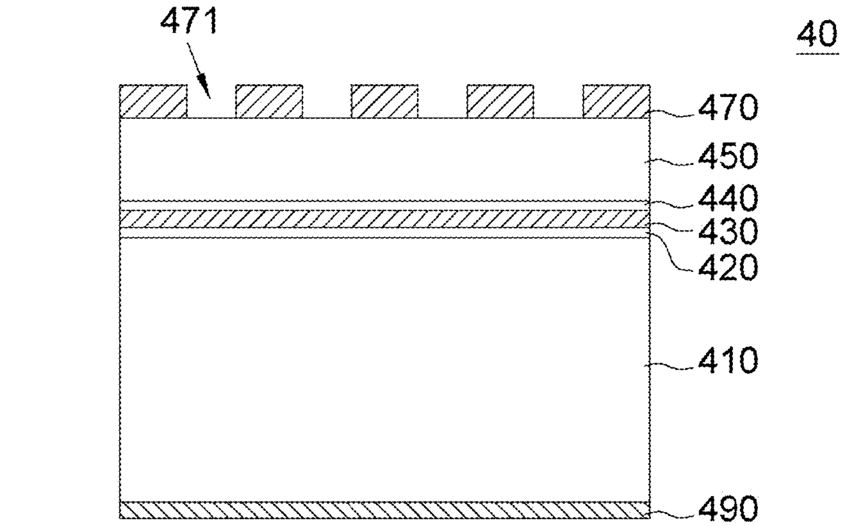
FIG. 6A is a schematic illustration showing a light emitting device according to a third embodiment of the invention.
Figure 6B:
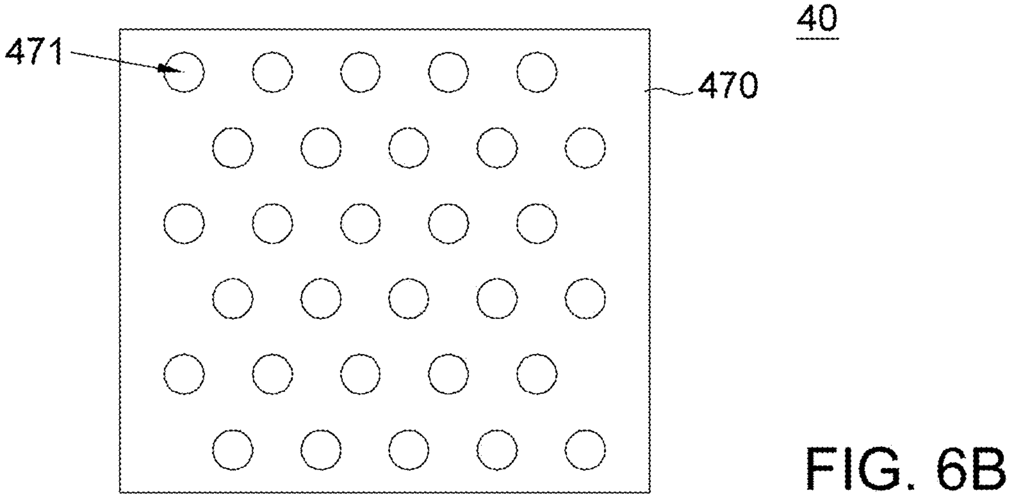
FIG. 6B is a top view showing the light emitting device of FIG. 6A.

FIG. 6A is a schematic illustration showing a light emitting device 40 according to a third embodiment of the invention. FIG. 6B is a top view showing the light emitting device of FIG. 6A. Referring to FIG. 6A, the light emitting device 40 includes a substrate 410, a first metal adhesive layer 420, a first metal layer 430, a second metal adhesive layer 440, a dielectric layer 450, a second metal layer 470 and a third metal layer 490. The difference between the light emitting device 40 of this embodiment and the light emitting device 30 of the second embodiment is that the second metal layer 470 has at least one hole. As shown in FIGS. 6A and 6B, the second metal layer 470 has many holes 471 in this example embodiment.

The second metal layer 470 has at least one hole 471. So, when the light emitting device 40 is heated, the infrared light transmitted in the waveguide mode of the dielectric layer 450 may be transmitted through the hole 471. Thus, the thickness of the second metal layer 470 of this embodiment is not particularly restricted to any specific range. In addition, the at least one hole 471 may be formed by way of lithography.

Furthermore, because the second metal layer 470 has at least one hole 471, it is also possible to induce the surface plasma modes in the interface between the dielectric layer 450 and the second metal layer 470, and the interface between the second metal layer 470 and the air when the light emitting device 40 is heated. That is, when the light emitting device 40 is heated, the dielectric layer 450 has two modes including a surface plasma mode and a waveguide mode. The infrared light generated in the waveguide mode relates to the thickness of the dielectric layer 450. In the surface plasma mode, the infrared light is generated by the electric field oscillation around the interface between the dielectric layer 450 and the second metal layer 470 and the interface between the second metal layer 470 and the air. Because the frequency of the electric field oscillation relates to the arranging periodicity of the holes, the infrared light generated in the surface plasma mode relates to the arranging periodicity of the holes 471 of the second metal layer 470. Thus, the arranging periodicity of the holes 471 may be reduced so that the wavelength of the infrared light generated in the surface plasma mode may be reduced and the wavelength of the infrared light generated in the surface plasma mode is different from the wavelength of the infrared light generated in the waveguide mode.

Figure 7:
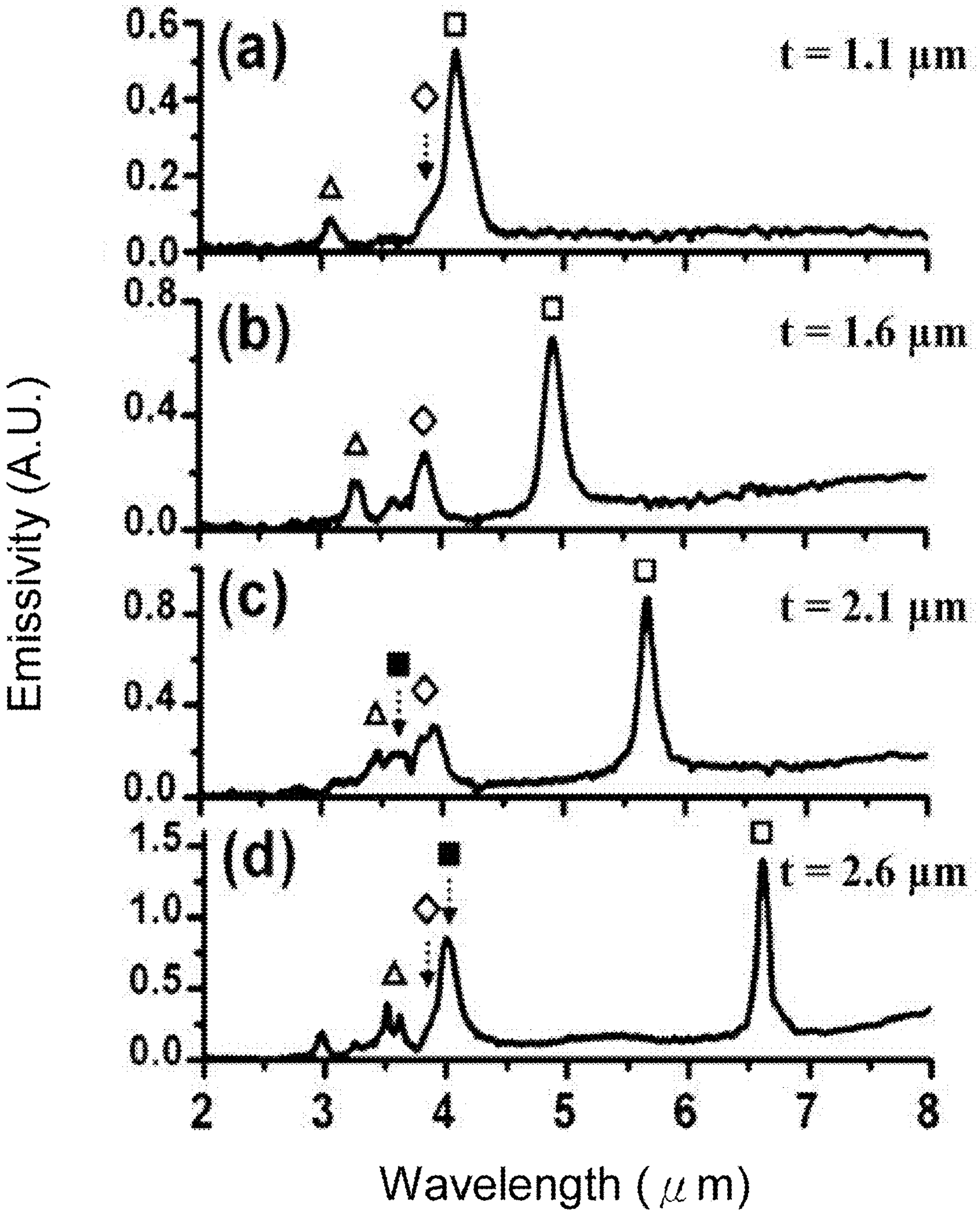
FIG. 7 shows the spectrum of the light emitting device of FIG. 6A.

FIG. 7 shows the spectrum of the light emitting device of FIG. 6A. As shown in FIG. 7, when the current flows through the third metal layer 490, the light emitting device 40 is heated and it is possible to measure the spectrum of the light emitted from the light emitting device 40, as shown in FIG. 7. In FIG. 7, the wavelength of the infrared light generated in the basic mode of the waveguide mode of the dielectric layer 450 corresponds to the wavelength of the infrared light labeled with the hollow rectangle, and the wavelength of the infrared light generated in the surface plasma mode of the dielectric layer 450 corresponds to the wavelength of the infrared light labeled with the rhombus. As shown in FIG. 7, when the thickness of the dielectric layer 450 is gradually increased from 1.1 μm to 2.6 μm, the wavelength of the infrared light generated in the basic mode of the waveguide mode of the dielectric layer 450 is away from the wavelength of the infrared light generated in the surface plasma mode of the dielectric layer 450. Therefore, the wavelength of the generated infrared light may be adjusted by adjusting the thickness of the dielectric layer 450.

Figure 8:
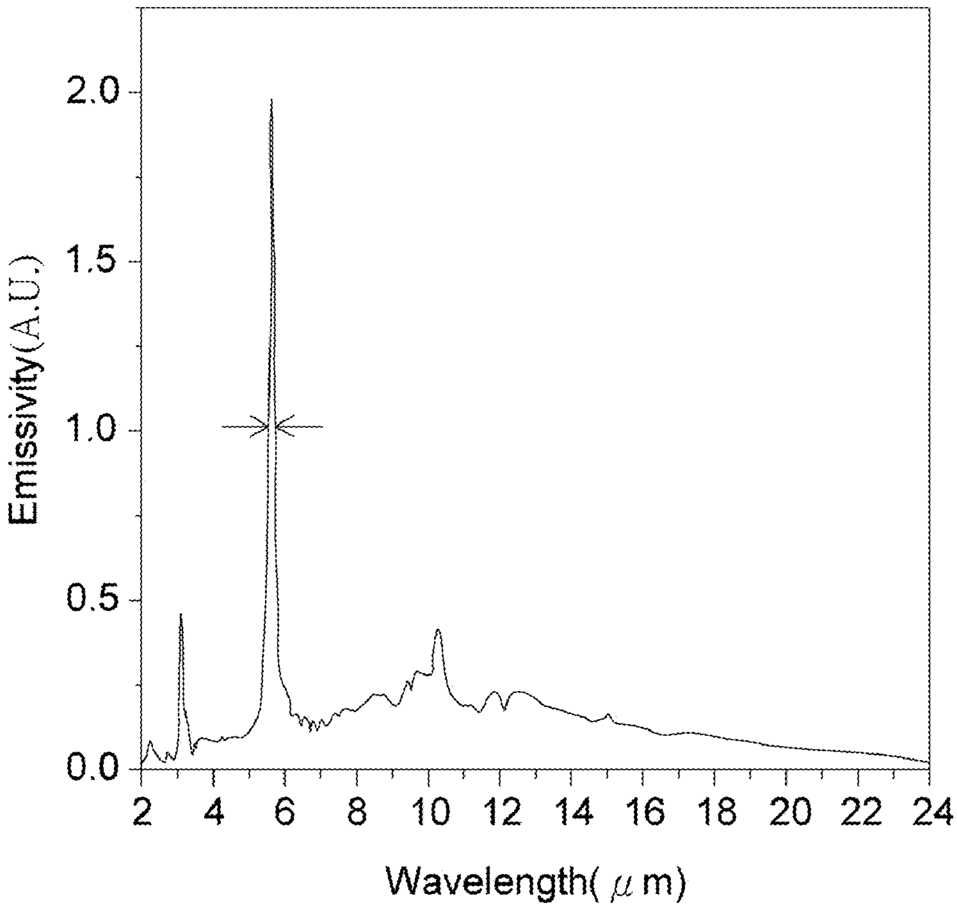
FIG. 8 shows another spectrum of the light emitting device of FIG. 6A.

According to the actual experimental results, as shown in FIG. 8, the ratio of the FWHM ($\Delta\lambda$) to the peak wavelength ($\lambda$) of the infrared light generated by the light emitting device of this embodiment may be reduced to about 3%. Thus, this embodiment can provide an infrared light emitting device, which can operate at the high-temperature and has the narrower frequency band.

Fourth Embodiment

Figure 9:
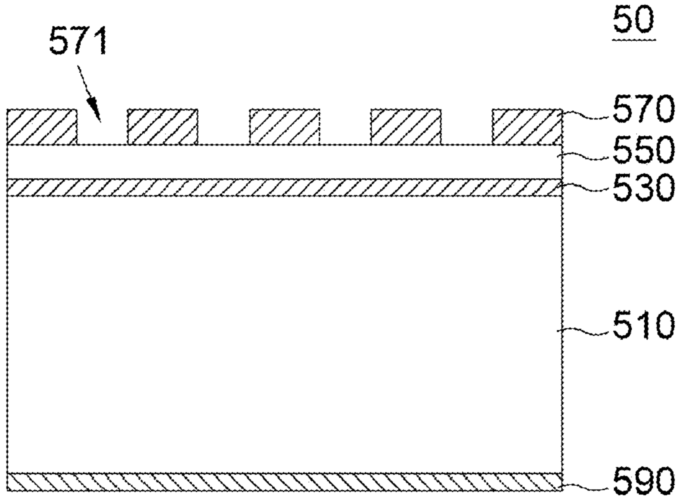
FIG. 9 is a schematic illustration showing a light emitting device according to a fourth embodiment of the invention.

FIG. 9 is a schematic illustration showing a light emitting device 50 according to a fourth embodiment of the invention. Referring to FIG. 9, the light emitting device 50 includes a substrate 510, a first metal layer 530, a dielectric layer 550, a second metal layer 570 and a third metal layer 590. The difference between the light emitting device 50 of this embodiment and the light emitting device 20 of the first embodiment is that the thickness of the dielectric layer 550 of the embodiment is smaller than a particular value, and the second metal layer 570 has at least one hole 571. As shown in FIG. 9, the second metal layer 570 has many holes 571 in the example embodiment.

In other embodiments of this disclosure, the thickness of the dielectric layer is greater than the particular value such that the dielectric layer has the waveguide mode and the infrared light can be thus generated. Thus, the thickness of the dielectric layer is reduced in this embodiment so that the infrared light generated by the light emitting device is generated in the surface plasma mode.

Figure 10:
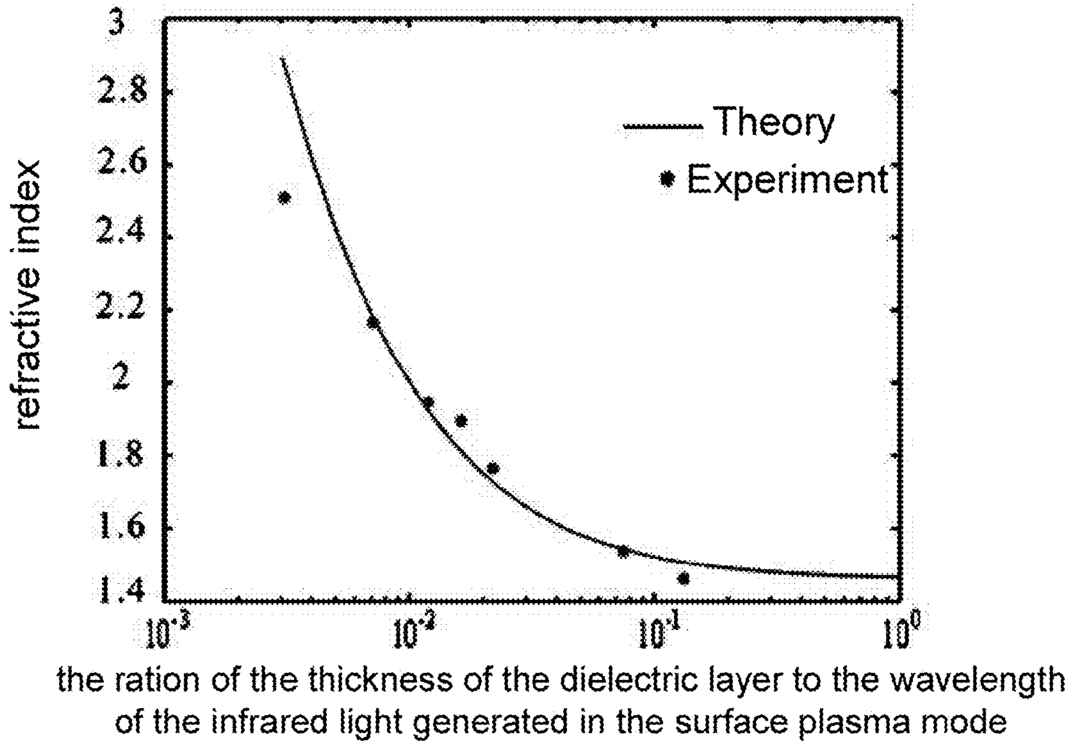
FIG. 10 shows the relationship between the ration of the thickness of the dielectric layer to the wavelength of the infrared light generated in the surface plasma mode and the refractive index of the dielectric layer in the light emitting device of FIG. 9.
Figure 11:
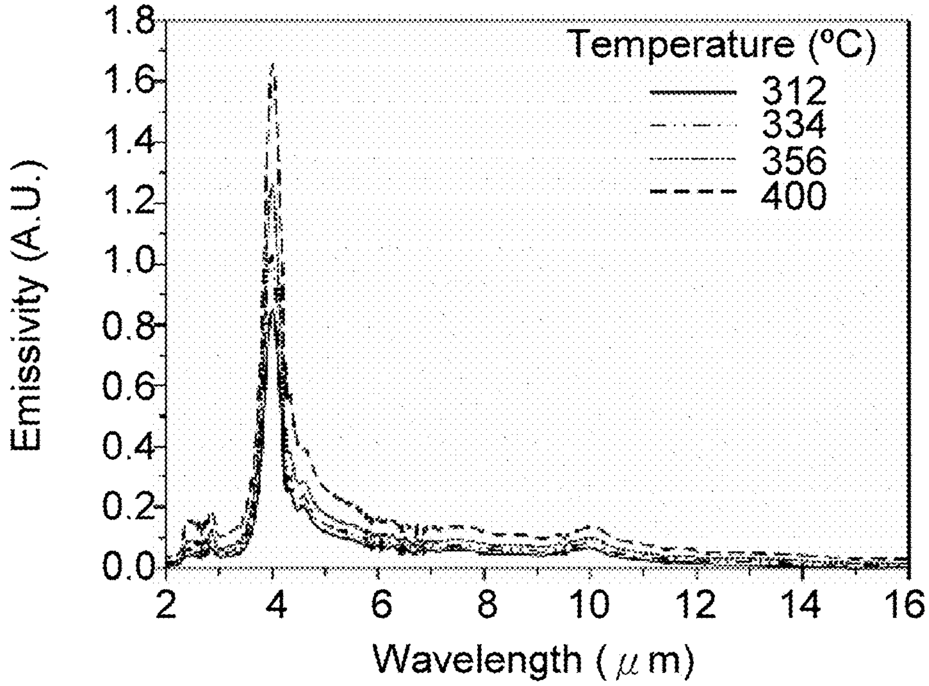
FIG. 11 shows the spectrum of the light emitting device of FIG. 9.

In this embodiment, the thickness of the dielectric layer 550 is smaller than the particular value, such as 500 nm, such that the dielectric layer 550 and the second metal layer 570 generate the surface plasma mode and are coupled to the first metal layer 530. The surface plasma mode generated by the dielectric layer 550 and the second metal layer 570 and the induced surface plasma mode coupling between the dielectric layer 550 and the first metal layer 530 become stronger as the thickness of the dielectric layer 550 gets smaller. Thus, the refractive index of the dielectric layer 550 is changed, thereby influencing the infrared wavelength generated by the dielectric layer 550, as shown in FIG. 10. The detail of FIG. 10 is disclosed by Si-Chen Lee et al. in "Coupling of surface plasmons between two silver films in a plasmonic thermal emitter", APPLIED PHYSICS LETTERS 91, 243111 (2007). More specifically, the infrared light wavelength and period generated by the surface plasma mode of the dielectric layer 550 relates to refractive index of the dielectric layer 550. When the thickness of the dielectric layer 550 approaches 100 nm, the ratio ($\Delta\lambda/\lambda$) of the FWHM ($\Delta\lambda$) to the peak wavelength ($\lambda$) of the infrared light generated in the surface plasma mode is about 10%, as shown in FIG. 11. This is also better than the ratio of the FWHM to the peak wavelength in the infrared light emitting device 1 of FIGS. 1A and 1B.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting device for generating infrared light, the light emitting device comprising:

a substrate having a first surface;

a first metal layer formed on the first surface of the substrate;

a dielectric layer formed on the first metal layer, wherein a thickness of the dielectric layer is greater than a particular value; and a second metal layer formed on the dielectric layer;

wherein when the light emitting device is heated, the dielectric layer has a waveguide mode such that the infrared light generated by the light emitting device is transmitted in the dielectric layer, and a wavelength of the infrared light generated in the waveguide mode relates to the thickness of the dielectric layer;

wherein the second metal layer has at least one first hole, the at least one first hole makes the dielectric layer have a surface plasma mode when the light emitting device is heated, and a wavelength of the infrared light generated in the surface plasma mode is different from a wavelength of the infrared light generated in the waveguide mode.

2. The light emitting device according to claim 1, further comprising a first metal adhesive layer and a second metal adhesive layer, wherein the first metal adhesive layer is formed between the substrate and the first metal layer, the second metal adhesive layer is formed on the first metal layer and the dielectric layer, materials of the first metal adhesive layer and the second metal adhesive layer are selected from the group consisting of a metal having a surface bonding strength greater than 20 MPa, a metal having a surface bonding strength greater than gold (Au) and silicon dioxide (SiO2), and combinations thereof.

3. The light emitting device according to claim 1, further comprising a third metal layer formed between the substrate and the first metal layer or on a second surface of the substrate, which is disposed opposite to the first surface.

4. The light emitting device according to claim 3, wherein the third metal layer comprises at least one of molybdenum (Mo) and a metal having an electrical conductivity ranging from 103 to 6×105 (1/cm- Ohm).

5. The light emitting device according to claim 1, wherein a material of the first metal layer is selected from the group consisting of gold (Au), silver (Ag), a metal having reflectivity and emissivity respectively ranging from 0.5 to 1 and from 0 to 0.5 in a middle infrared light wave band, and combinations thereof.

6. The light emitting device according to claim 1, wherein a thickness of the second metal layer ranges from about 3 to 40 nanometers (nm).

7. The light emitting device according to claim 1, wherein the second metal layer comprises at least one of silver (Ag) and a metal having reflectivity ranging from 0.5 to 1 in a middle infrared light wave band.

8. The light emitting device according to claim 1, wherein the substrate is a conductor substrate, an insulation substrate or a semiconductor substrate.

* * * * *